(12) United States Patent
Hsieh et al.

(10) Patent No.: US 6,457,598 B1
(45) Date of Patent: Oct. 1, 2002

(54) MODULE COVER ASSEMBLY WITH DOOR LATCH TRANSMISSION MECHANISM FOR WAFER TRANSPORT MODULE

(75) Inventors: Chang Yu Hsieh, Taichung Hsien; Jone Nan Chen, King Hu, both of (TW)

(73) Assignee: Prosys Technology Integration, Inc., Hsinchu (TW)

( * ) Notice: Subject to any disclaimer, the term of this patent is extended or adjusted under 35 U.S.C. 154(b) by 1 day.

(21) Appl. No.: 09/811,473

(22) Filed: Mar. 20, 2001

(51) Int. Cl.[7] .................................................. B65D 85/48

(52) U.S. Cl. ....................... 220/323; 206/1.5; 206/710; 292/66

(58) Field of Search ................................ 220/323, 315; 206/1.5, 710, 711; 292/66

(56) References Cited

U.S. PATENT DOCUMENTS

| | | | |
|---|---|---|---|
| 5,915,562 A | | 6/1999 | Nyseth |
| 5,931,512 A | * | 8/1999 | Fan et al. ...................... 292/66 |
| 5,957,292 A | * | 9/1999 | Mikkelsen et al. ......... 206/710 |
| 6,105,782 A | * | 8/2000 | Fujimori et al. ............ 206/710 |

* cited by examiner

Primary Examiner—Nathan J. Newhouse
(74) Attorney, Agent, or Firm—Rosenberg, Klein & Lee

(57) ABSTRACT

A module cover is equipped with at least one door latch transmission mechanism for closing the entrance of a wafer transport module, each door latch transmission mechanism includes a door latch supported on a roller at the module cover, a latch bolt pivotally coupled between one end of the door latch and a part of the module cover, and a driving wheel coupled to the module cover and rotated to move the door latch forwards and backwards and to further turn the latch bolt in and out of a through hole on the module cover and a respective latch hole on the wafer transport module to lock/unlock the module cover.

7 Claims, 7 Drawing Sheets

MODULE COVER ASSEMBLY WITH DOOR LATCH TRANSMISSION MECHANISM FOR WAFER TRANSPORT MODULE

BACKGROUND OF THE INVENTION

1. Field of the Invention

The present invention relates to a wafer transport module and, more specifically, to a door latch transmission mechanism for a module cover for wafer transport module, which can smoothly accurately be moved between the locking position and the unlocking position with less effort.

2. Brief Description of the Prior Art

Before becoming an IC chip, a wafer must be processed through a series of processing procedures including diffusion, printing, etching, masking, reading, and etc. Transport means are used in factory to deliver wafers from one working area to another. These transport means (cassette, boat, POD, or FOUP) are mainly to protect wafers against contamination of dust and external objects. FIG. 1 illustrates a transport means for this purpose. This transport means is constructed according to U.S. Pat. No. 5,915,562, issued to Nyseth et al., entitled "Transport Module With Latching Door". The wafer transport module 1 comprises a module body 10 and a module cover 20. The module body 10 is adapted to carry wafers W, having an opening 11 at one side thereof and a plurality of latch holes 13 disposed around the opening 11. The module cover 20 comprises an outer cover panel 21, and at least one door latch 27 respectively slidably disposed on the inside. The outer cover panel 21 of the module cover 20 comprises at least one lock cylinder hole 25 or rotary handle 253. An implement can be inserted to rotate each lock cylinder hole 25 and rotated to move the respective door latch 27 in and out of a corresponding peripheral through hole 23 of the module cover 20. Alternatively, the user can directly rotate the rotary handle 253 to move the respective door latch 27 in and out of the corresponding peripheral through hole 23 of the module cover 20. In order to let the module cover 20 close the opening 11 of the module body 10 tightly to protect storage wafers W against outside dust, the door latch 27 will be moved forwards (toward the corresponding latch hole 13) and then outwards (toward the outer cover panel 21) when extending out of the respective peripheral through hole 23, to engage the corresponding latch hole 13. To achieve this function, the door latch transmission mechanism of the aforesaid design comprises a rotary wheel 29. The rotary wheel 29 comprises a protruded center mount 293 aimed at one lock cylinder hole 25 on the outer cover panel 21 for receiving an implement being inserted into the lock cylinder hole 25 for enabling the rotary wheel 29 to be rotated by the implement, at least one first eccentric guide slot 295 and at least one second eccentric guide slot 296. The door latch 27 comprises a first latch 271 and a second latch 272. The first latch 271 has a front coupling rod 275 coupled to one first eccentric guide slot 296 of the rotary wheel 29. The second latch 272 has a front coupling rod 276 coupled to one second eccentric guide slot 296. When rotating the rotary wheel 29, the first latch 271 and the second latch 272 are respectively moved. The first latch 271 and the second latch 272 are arranged in a stack. After extended out of the respective peripheral through hole 23 (the X-axis direction), the first latch 271 is forced by the second latch 272 to move in Y-axis direction and to engage the corresponding latch hole 13. This design of door latch transmission mechanism has numerous drawbacks as outlined hereinafter.

1. Because the second latch forces the first latch into engagement with the corresponding latch hole, dust tends to be produced to contaminate storage wafers during friction between the first latch and the second latch.
2. Because the second latch rubs against the inner surface of the outer cover panel of the module cover during its movement, dust may be produced to contaminate storage wafers due to friction between the second latch and the inner surface of the outer cover panel.
3. During sliding movement of the door latch, much resistance is produced against the movement of the first latch and the second latch, and therefore much effort must be employed to rotate the rotary wheel.
4. Because the second latch is adapted to force the first latch into engagement with the corresponding latch hole, the first latch and the second latch must be will matched. Therefore, the fabrication of the component parts of the door latch transmission mechanism is complicated.

SUMMARY OF THE INVENTION

The invention has been accomplished under the circumstances in view. It is therefore the main object of the present invention to provide a module cover for a wafer transport module, which eliminates the aforesaid drawbacks. It is another object of the present invention to provide a module cover, which greatly reduces the production of dust when operated to close/open the wafer transport module. It is still another object of the present invention to provide a module cover for a wafer transport module, which can easily be opened and closed with less effort. It is still another object of the present invention to provide a module cover for a wafer transport module, which has a simple structure and, is inexpensive to manufacture. To achieve these and other objects of the present invention and according to one aspect of the present invention, the module cover assembly comprises a module cover and at least one door latch transmission mechanism adapted to lock/unlock the module cover. The at least one door latch transmission mechanism each comprises a door latch supported on a roller at the module cover, a latch bolt pivotally coupled between one end of the door latch and a part of the module cover, and a driving wheel coupled to the module cover and rotated to move the door latch forwards and backwards and to further turn the latch bolt in and out of a through hole on the module cover and a respective latch hole on the wafer transport module to lock/unlock the module cover. According to another aspect of the present invention, the driving wheel of each door latch transmission mechanism comprises a center mount coupled to a handle means that is disposed outside the module cover for operation by hand to rotate the driving wheel, and a smoothly arched eccentric guide slot; the door latch of each door latch transmission mechanism comprises an upright coupling rod disposed at one end and coupled to the smoothly arched eccentric guide slot of the respective driving wheel for enabling the door latch to be moved forwards and backwards by the respective driving wheel.

DETAILED DESCRIPTION OF THE PREFERRED EMBODIMENT

Figure 1:
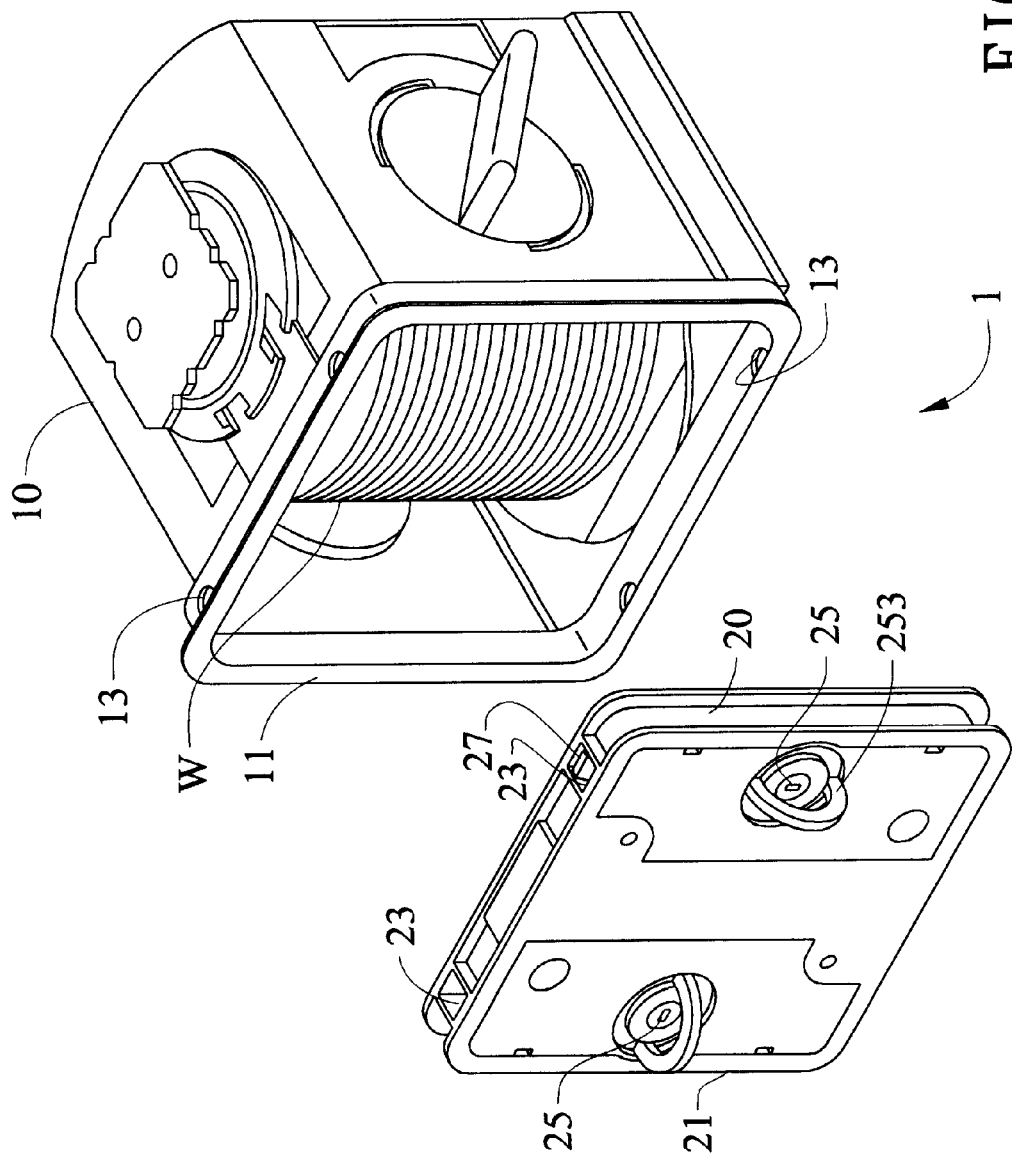
FIG. 1 is a perspective view of a wafer transport module according to the prior art showing the module cover removed from the body of the wafer transport module.
Figure 2:
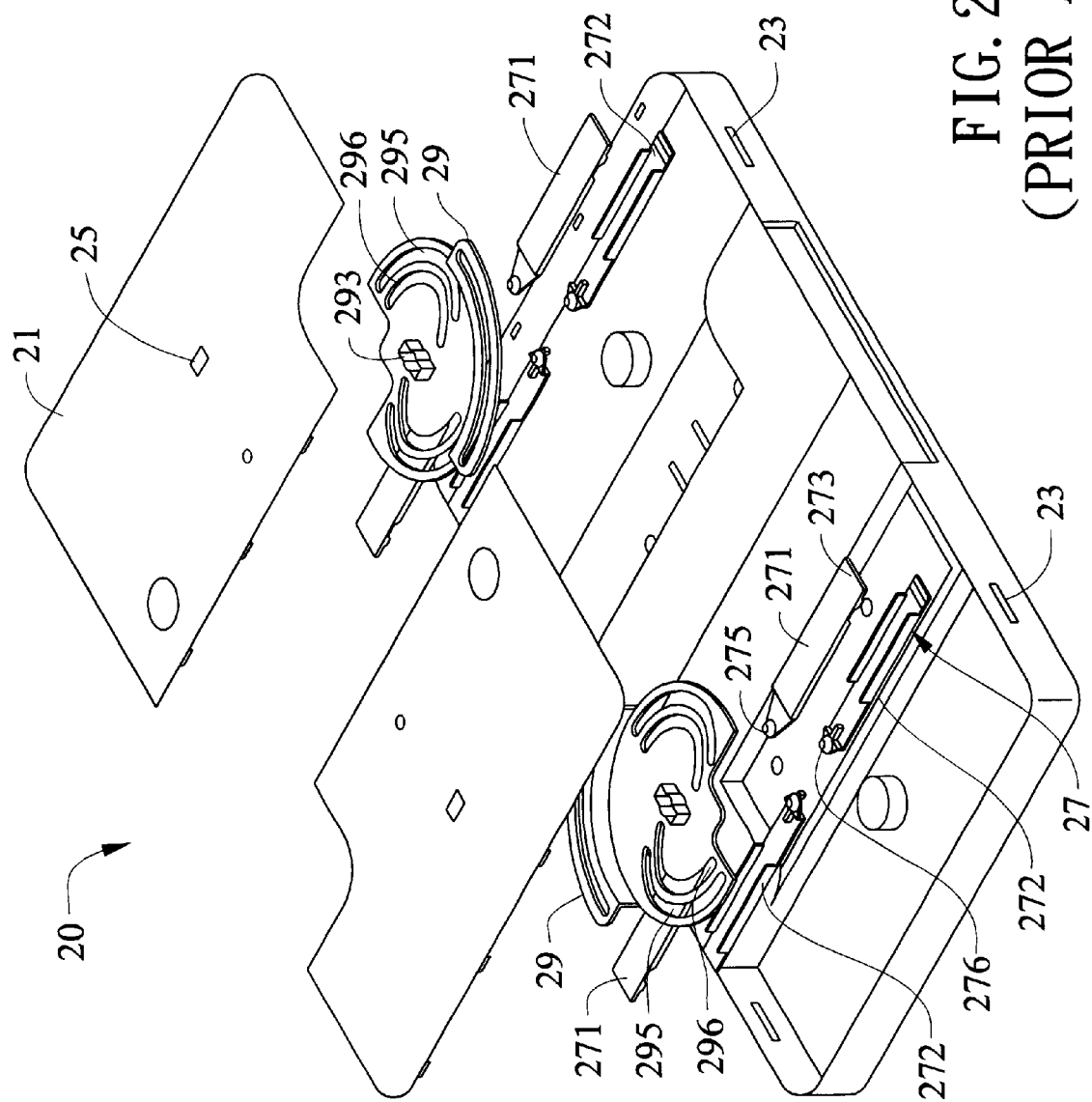
FIG. 2 is an exploded view of the module cover for the wafer transport module according to the prior art.
Figure 3:
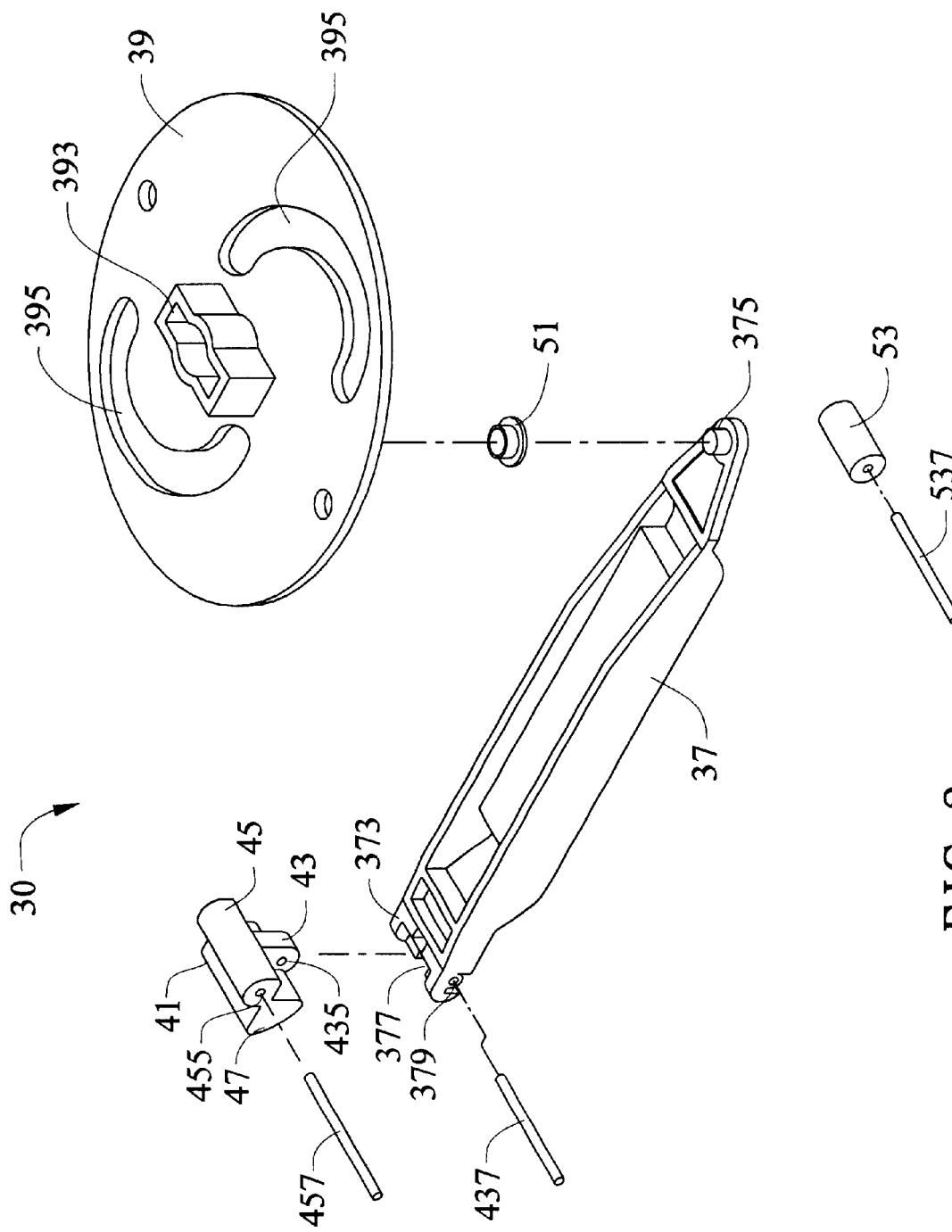
FIG. 3 is an exploded view of a door latch transmission mechanism for a wafer transport module cover according to the present invention.
Figure 5:
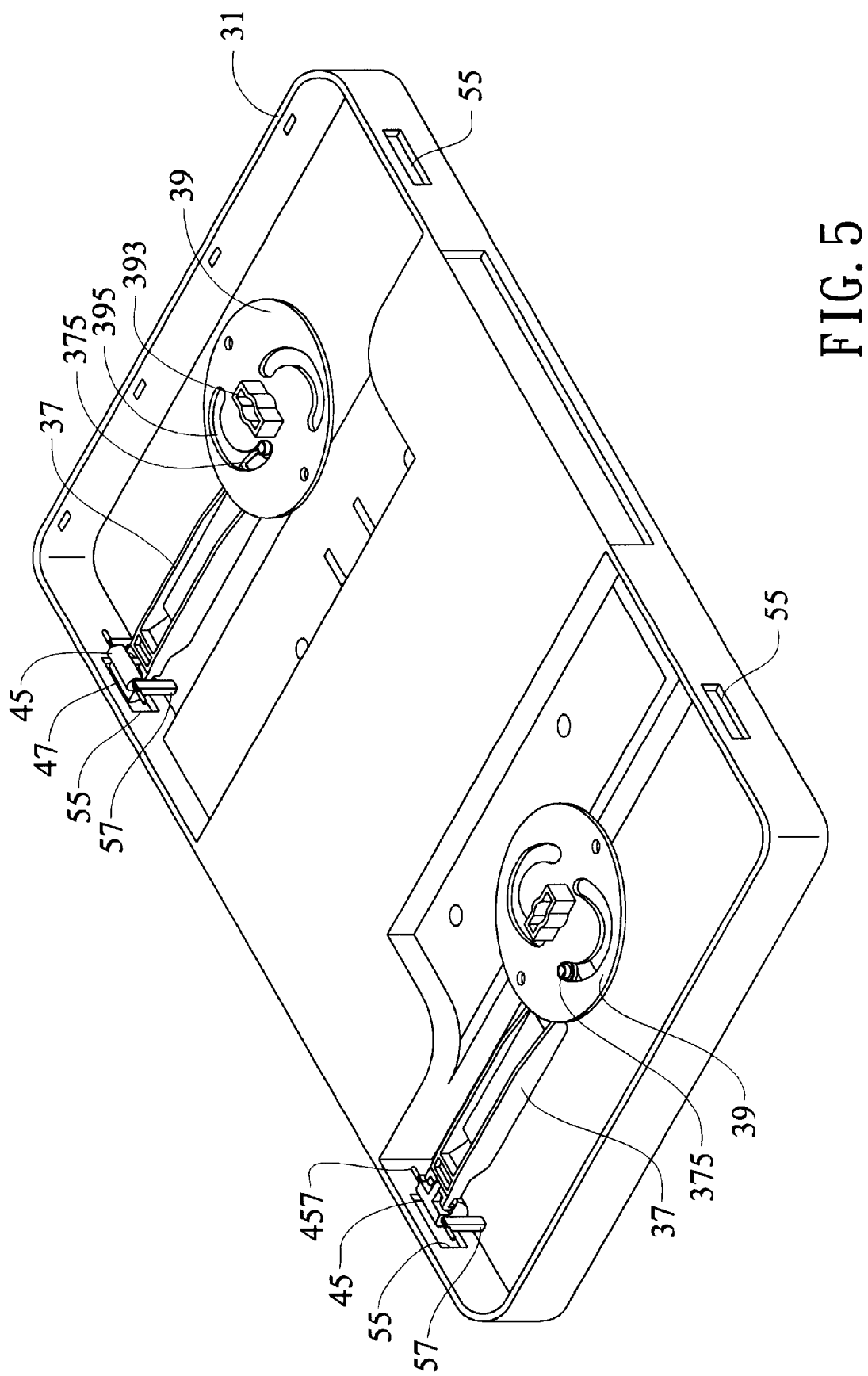
FIG. 5 is an applied view of the present invention, showing the door latch transmission mechanism installed in a wafer transport module cover.

Referring to FIGS. 3 and 5, the door latch transmission mechanism, referenced by 30, comprises a driving wheel 39, a door latch 37, and a latch bolt 41. The driving wheel 39 comprises a protruded center mount 393 to which handle means (not shown) is connected for rotating the driving wheel 39 to move the door latch 37, and at least one, for example two smoothly arched eccentric guide slots 395 symmetrically disposed at two sides relative to the protruded center mount 393. The door latch 37 has a front notch 377 at one end, namely, the front end 373 thereof, two pivot holes 379 aligned at two sides of the front notch 377, and a coupling rod 375 at the other end, namely, the rear end thereof. The coupling rod 375 is inserted through one smoothly arched eccentric guide slot 395 of the driving wheel 39, enabling the door latch 37 to be moved upon rotary motion of the driving wheel 39. The latch bolt 41 comprises a bottom lug 43, a top coupling block 45, and a front retaining block 47. The lug 43 is inserted into the front notch 377 of the door latch 37 having a pivot hole 435 pivotally connected between the pivot holes 379 of the door latch 37 by a pivot 437, for enabling the latch bolt 41 to be moved with the door latch 37. The top coupling block 45 has a pivot hole 455 pivotally connected to a part of the wafer transport module cover, referenced by 31 by a pivot 457. The front retaining block 47 of the retainer block 47 is moved with the door latch 37 in and out of a through hole 55 on the vertical peripheral wall of the wafer transport module cover 31 (see FIG. 5) to lock/unlock the wafer transport module cover 31. A cylindrical roller 53 is revolvably coupled to the driving wheel 39 by a pivot 537 to support the rear end of the door latch 37 on the wafer transport module cover 31 and to prevent direct contact between the door latch 37 and the wafer transport module cover 31, for enabling the door latch 37 to be smoothly moved with the driving wheel 39 in and out of the through hole 55. A cushion cap 51 is revolvably capped onto the coupling rod 375 and inserted with the coupling rod 375 into one eccentric guide slot 395 of the driving wheel 39 to buffer the pressure employed onto the coupling rod 375 upon rotary motion of the driving wheel 39.

Figure 4A:
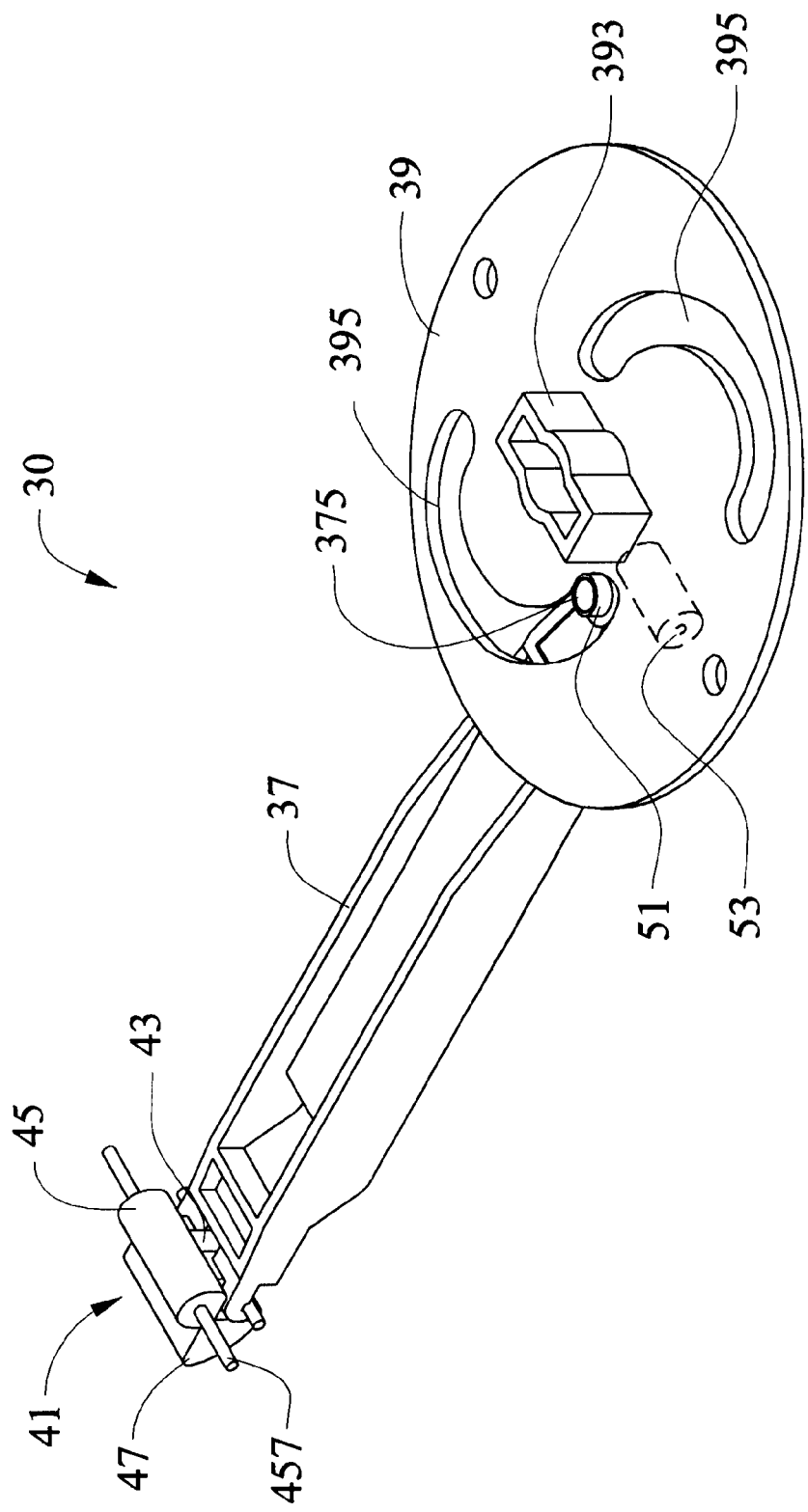
FIG. 4A is a perspective view of the present invention showing the latch bolt turned to the unlocking position.
Figure 4B:
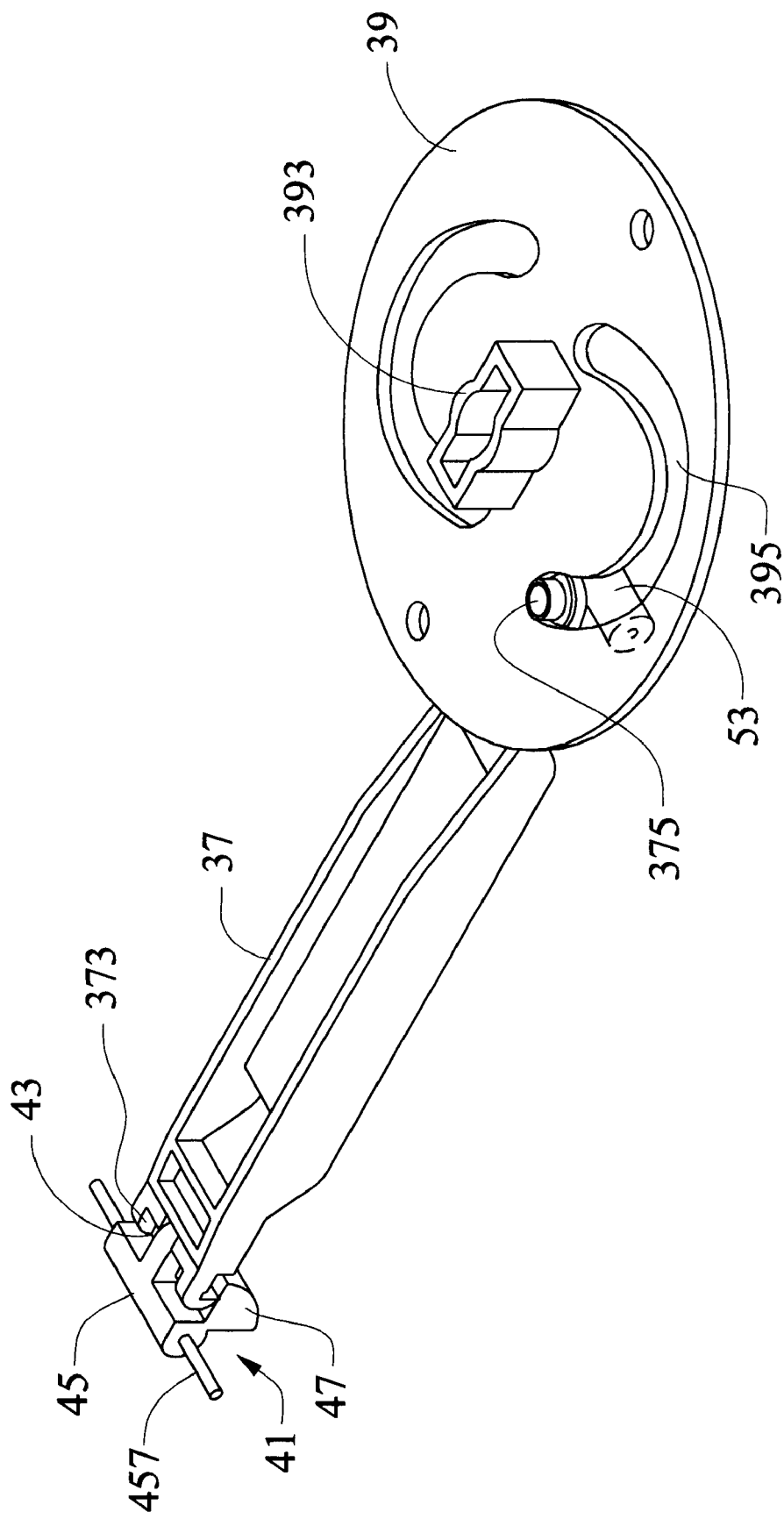
FIG. 4B is similar to FIG. 4A but showing the latch bolt turned to the locking position.

Referring to FIGS. 4A and 4B and FIG. 5 again, after installation of the door latch transmission mechanism 30 in the wafer transport module cover 31, the center mount 393 of the driving wheel 39 and the top coupling block 45 of the latch bolt 41 are the fixed bearing points, i.e., the center of the center mount 393 as well as the center of the top coupling block 45 of the latch bolt 41 are constantly maintained immovable. When rotating the driving wheel 39 to shift the center mount 393 to the transverse position as shown in FIG. 4A, the cushion cap 51 and the coupling rod 375 of the door latch 37 are moved to a first position near the center of the driving wheel 39, the door latch 37 is pulled backwards, and the latch bolt 41 is turned about the pivot 457 in counter-clockwise direction, and therefore the front retaining block 47 is shifted to the unlocking position below the top coupling block 45. On the contrary, when rotating the driving wheel 39 to shift the center mount 393 to the longitudinal position as shown in FIG. 4B, the cushion cap 51 and the coupling rod 375 of the door latch 37 are moved to a second position far from the center of the driving wheel 39, the door latch 37 is pushed forwards, and the latch bolt 41 is turned about the pivot 457 in clockwise direction, and therefore the front retaining block 47 is shifted to the locking position in front of the top coupling block 45. The front retaining block 47 of the latch bolt 41 has a sector-like cross section. It is moved forwards in X-axis direction and turned upwards in Y-axis direction when turning the driving wheel 39 to push the door latch 37 forwards. Therefore, the front retaining block 47 of the latch bolt 37 can be smoothly fitted into the corresponding latch hole on the wafer transport module.

Referring to FIG. 5, two door latch transmission mechanisms 30 are installed in the wafer transport module cover 31. The pivot 457 of each door latch transmission mechanism 30 is connected between two upright-supports 57 in the wafer transport module cover 31, and the roller 53 of each door latch transmission mechanism 30 is maintained in contact with the inside wall of the wafer transport module cover 31, and therefore the door latch 37 of each door latch transmission mechanism 30 is kept away from the inside wall of the wafer transport module cover 31. When moving the door latch 37 between the locking position and the unlocking position, the door latch 37 is not rubbed against the wafer transport module cover 31. Therefore, the door latch 37 of each door latch transmission mechanism 30 can be smoothly moved between the locking position and the unlocking position with less effort without producing much dust. According to the present invention, one eccentric guide slot 395 is enough to move the door latch 37 between the locking position and the unlocking position.

Figure 6:
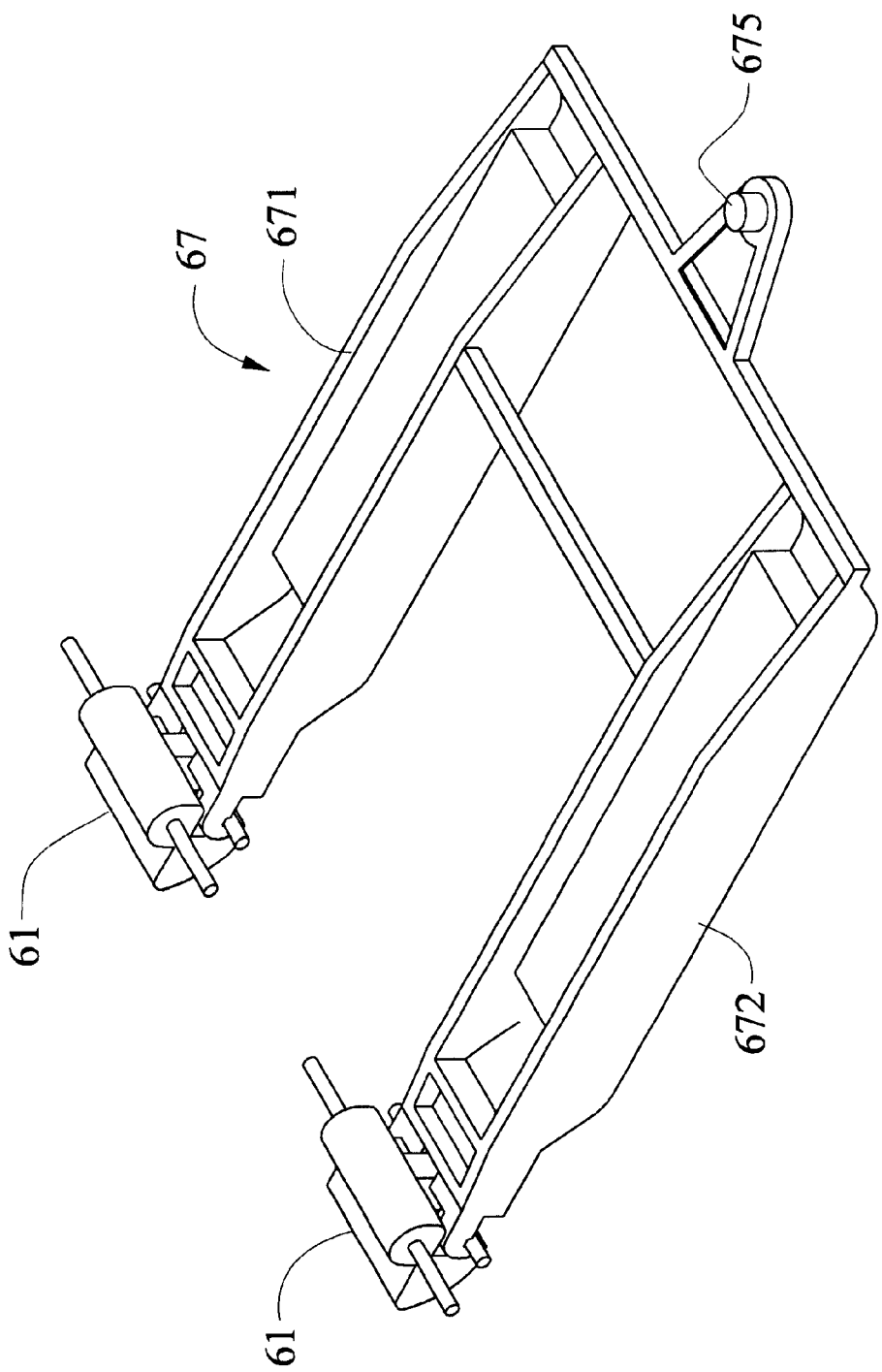
FIG. 6 is a perspective view of an alternate form of the present invention (the driving wheel excluded).

Referring to FIG. 6, the latch, referenced by 67, comprises a coupling rod 675 disposed at the rear end thereof and adapted for coupling to one eccentric guide slot 395 of the driving wheel 39 (see also FIG. 3), and two latch arms 671 and 672 connected in parallel. The latch arms 671 and 672 each have a free end pivotally mounted with a respective latch bolt 61.

A prototype of door latch transmission mechanism has been constructed with the features of FIGS. 3~6. The door latch transmission mechanism functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A module cover assembly comprising a module cover for closing the entrance of a wafer transport module, said module cover comprising at least one through hole on an upright peripheral wall thereof respectively aimed at a respective latch hole on the wafer transport module with which said module cover is used, and at least one door latch transmission mechanism installed in said module cover and respectively moved in and out of said at least one through hole of said module cover and a respective latch hole on the wafer transport module with which said module cover is used to lock/unlock said module cover, wherein said at least one door latch transmission mechanism each comprises:

a driving wheel, said driving wheel comprising a protruded center mount adapted to receive handle means at the wafer transport module with which said module cover is used, for enabling said driving wheel to be rotated through which said handle means, and at least one smoothly arched eccentric guide slot;

a door latch, said door latch comprising a front end, a rear end, a front notch disposed at said front end, and a coupling rod disposed at said rear end and coupled to one smoothly arched eccentric guide slot of said driving wheel for enabling said door latch to be moved forwards and backwards between the locking position and the unlocking position; and a latch bolt coupled to the front end of said latch bolt and moved with said latch bolt in and out of one of said at least one through hole of said module cover and the corresponding latch hole on the wafer transport module with which said module cover is used to lock/unlock said module cover, said latch bolt comprising a bottom lug inserted into the front notch of said door latch and pivotally connected to the front end of said door latch by a pivot, a top coupling block pivotally connected to a part of the module cover by a pivot, and a front retaining block adapted for moving in and out of one of said at least one through hole of said module cover and the corresponding latch hole on the wafer transport module with which said module cover is used to lock/unlock said module cover.

2. The module cover of claim 1 wherein said at least one door latch transmission mechanism each further comprises a cylindrical roller revolvably coupled to the respective driving wheel by a pivot to support the rear end of said door latch on said module cover and to guide movement of said door latch on said module cover.

3. The module cover of claim 1 wherein said at least one door latch transmission mechanism each further comprises a cushion cap revolvably capped on the coupling rod of the respective door latch and inserted with the coupling rod of the respective door latch into one eccentric guide slot of the respective driving wheel.

4. The module cover of claim 1 wherein the front retaining block of the latch bolt of each of said at least one door latch transmission mechanism has a sector-like cross section.

5. The module cover of claim 1 further comprising handle means disposed outside said module cover and respectively coupled to the center mount of the driving wheel of each of said at least one door latch transmission mechanism for operation by hand to rotate the driving wheel of each of said at least one door latch transmission mechanism.

6. The module cover of claim 1 wherein said module cover comprises upright support means adapted to support the pivot at top coupling block of the latch bolt of each of said at least one door latch transmission mechanism.

7. A module cover assembly comprising a module cover for closing the entrance of a wafer transport module, said module cover comprising at least one through hole on an upright peripheral wall thereof respectively aimed at a respective latch hole on the wafer transport module with which said module cover is used. and at least one door latch transmission mechanism installed in said module cover and respectively moved in and out of said at least one through hole of said module cover and a respective latch hole on the wafer transport module with which said module cover is used to lock/unlock said module cover, wherein said at least one door latch transmission mechanism each comprises:

a driving wheel, said driving wheel comprising a protruded center mount adapted to receive handle means at the wafer transport module with which said module cover is used, for enabling said driving wheel to be rotated through which said handle means, and at least one smoothly arched eccentric guide slot;

a door latch, said door latch comprising two latch arms connected in parallel, said latch arms each having a front end and a rear end, the rear ends of said latch arms being fixedly connected in parallel, and a coupling rod disposed at the connecting area between the rear ends of said latch arms and coupled to one smoothly arched eccentric guide slot of said driving wheel for enabling said door latch to be moved forwards and backwards between the locking position and the unlocking position; and two latch bolts respectively coupled to the front end of each of said latch arms of said door latch and moved with said latch bolt in and out of said at least one through hole of said module cover and the corresponding latch holes on the wafer transport module with which said module cover is used to lock/unlock said module cover, said latch bolts each comprising a bottom lug inserted into the front notch of said door latch and pivotally connected to the front end of said door latch by a pivot, a top coupling block pivotally connected to a part of the module cover by a pivot, and a front retaining block adapted for moving in and out of one of said at least one through hole of said module cover and the corresponding latch hole on the wafer transport module with which said module cover is used to lock/unlock said module cover.

* * * * *